United States Patent [19]

Noro

[11] Patent Number: 4,498,057
[45] Date of Patent: Feb. 5, 1985

[54] POWER AMPLIFIER WITH POWER SUPPLY SWITCHING

[75] Inventor: Masao Noro, Hamamatsu, Japan

[73] Assignee: Nippon Gakki Seizo Kabushiki Kaisha, Hamamatsu, Japan

[21] Appl. No.: 452,866

[22] Filed: Dec. 23, 1982

[30] Foreign Application Priority Data

Dec. 25, 1981 [JP] Japan ................................. 56-211480

[51] Int. Cl.³ .............................................. H03F 3/30
[52] U.S. Cl. ..................................... 330/297; 330/263
[58] Field of Search ............... 330/267, 268, 273, 274, 330/297, 263

[56] References Cited

U.S. PATENT DOCUMENTS 4,329,657  5/1982  Kamiya ................................ 330/297

Primary Examiner—James B. Mullins
Attorney, Agent, or Firm—Cushman, Darby & Cushman

[57] ABSTRACT

A power amplifier with power supply switching is arranged so that large positive and negative power supply voltages are supplied to collectors of second and fourth transistors via first and third transistors, respectively. Small positive and negative power supply voltages are supplied to collectors of the second and fourth transistors, respectively, and an input signal of the amplifier is amplified by the second and fourth transistors to supply an output of the amplifier to a load, wherein to a base of the first transistor is selectively applied either a divided voltage between a positive constant voltage greater than the small positive power supply voltage and the voltage of the input signal or a voltage which is a sum of the voltage of the input signal and a positive constant voltage. To the base of the third transistor is selectively applied either a divided voltage between a negative constant voltage greater than the small negative power supply voltage and the voltage of the input signal or a voltage which is a sum of the voltage of the input signal and a negative constant voltage. Such selections of application for the bases of the first and third transistors are made in response to a magnitude of the frequency of said input signal.

20 Claims, 10 Drawing Figures

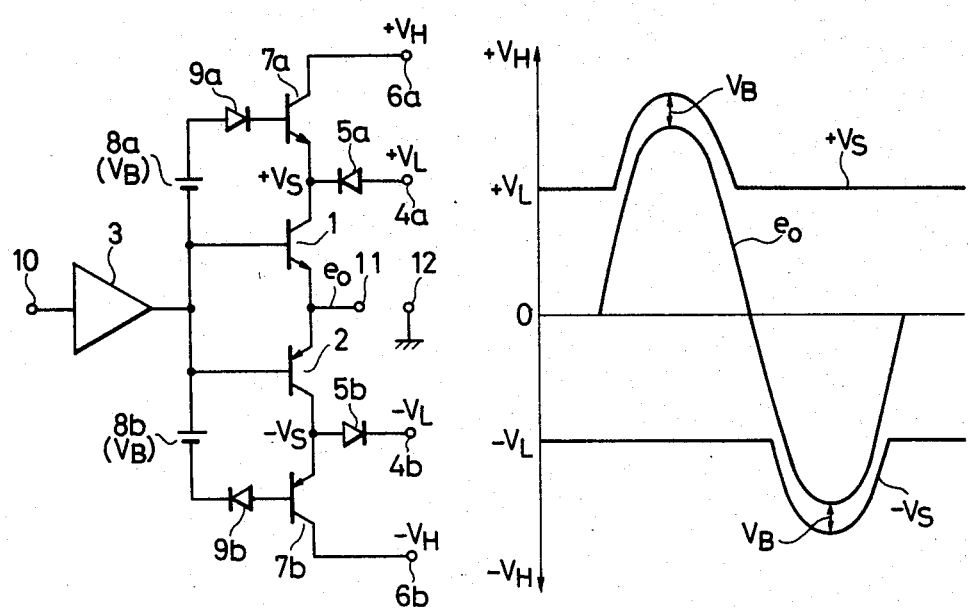
PRIOR ART FIG. 4
FIG. 5
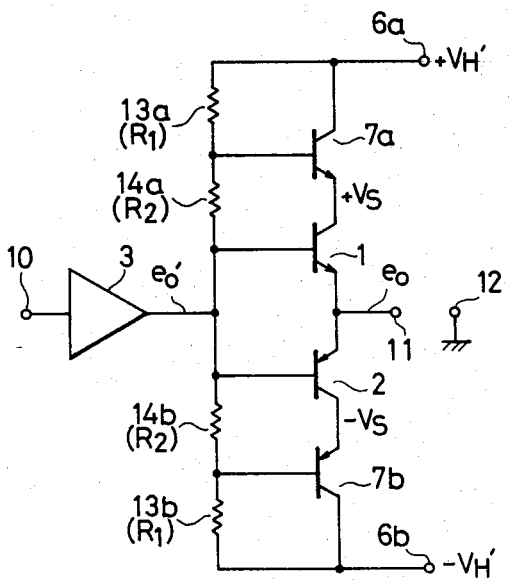
PRIOR ART FIG. 6

POWER AMPLIFIER WITH POWER SUPPLY SWITCHING

BACKGROUND OF THE INVENTION (a) Field of the Invention

The present invention concerns a power amplifier designed to enhance power efficiency by switching power supply voltages in accordance with the magnitude and the frequency of the input signal to be amplified.

(b) Description of the prior art

In the past, known power amplifiers existed which were intended, for example, for audio systems, and arranged so that the power supply voltage which is supplied to an output amplifying device was varied between high level and low level in accordance with the amplitude of the input signal to be amplified, to thereby reduce the power loss of the output amplifying device and to improve power efficiency. Power amplifiers of this type may be divided into two groups. The first is arranged such that, as shown by way of the waveshape in, for example, FIG. 1, in the region wherein the output voltage $e_0$ exceeds a predetermined level, the power supply voltage $+V_S$ (or $-V_S$) undergoes a stepwise increase or switching from a voltage level $+V_L$ (or $-V_L$) to a voltage level $+V_H$ (or $-V_H$). The second group is arranged such that, as shown in FIG. 2, in the region wherein the output voltage $e_0$ exceeds a predetermined level, the power supply voltage $+V_S$ (or $-V_S$) is varied bootstrapwise from the voltage $+V_L$ (or $-V_L$) only for the amount corresponding to the change in the voltage $e_0$. In each of these two types of known power amplifiers, arrangement is made so that the switching-over of power supplies is carried out with a certain delay time to prevent the occurrence of problems such as, in the case where the frequency of the input signal is high, the power supplies are frequently switched over between them, causing noise generation, and developing distortions. Accordingly, in case the frequency of the input signal is low, as shown in the period $T_1$ in FIGS. 1 and 2, the connection of the power supplies is switched over in real time substantially corresponding to the region in which the output voltage $e_0$ exceeds a predetermined level. However, in case the frequency of the input signal is high as shown in the period $T_2$ in FIGS. 1 and 2, the power supply voltage $+V_S$ (or $-V_S$) will be held in its elevated state even when the output voltage $e_0$ stays in the region below the predetermined level. Therefore, in the conventional power amplifier of this type, there has been the problem that in case the frequency of the input signal is high, the effect of improvement of power efficiency becomes lowered.

Next, consideration will be made of the voltage which is applied to an output amplifying device in the conventional power amplifier of this type, with respect to the instance wherein the power amplifier is constructed with a push-pull amplifying circuit using an NPN transistor 1 and a PNP transistor 2 to serve as the output amplifying devices as shown in FIG. 3.

In this circuit, the voltages $V_{C1}$ and $V_{C2}$ which are applied across the collectors and the emitters, respectively, of the transistors 1 and 2 become a voltage $(V_L+V_H)$ which is maximum at, for example, time $t_2$ and $t_1$ for an input signal having a low frequency as that shown in the period $T_1$ in FIGS. 1 and 2. For an input signal having a high frequency as shown in the period $T_2$, the voltages $V_{C1}$ and $V_{C2}$ will become $2V_H$ at maximum, respectively, which is of a value greater than that $(V_L+V_H)$ for the signal of low frequency. Thus, in the conventional power amplifier, it will be noted that, when the frequency of the input signal becomes high, the voltage which is applied to the output amplifying device will become elevated as compared with the instance wherein the frequency of the input signal is low. Hence, there has been the problem that the maximum rated voltage, especially $V_{CEO}$, of the output amplifying device has to be selected higher correspondingly for the amount of the elevation. This has been a very important problem especially in case the power amplifier of this type is intended to be applied to the power amplification for a large output.

SUMMARY OF THE INVENTION

It is, therefore, a primary object of the present invention to provide a power amplifier which is capable of obtaining a high power efficiency as well as preventing noise or distortion generation even when the frequency of the signal to be amplified is high.

Another object of the present invention is to provide a power amplifier of the type as described above, which is capable of reducing the voltage which is applied to the output amplifying device as compared with that in the prior art.

Still another object of the present invention is to provide a power amplifier of the type as described above, which can use a device whose maximum rated voltage is low, to serve as the output amplifying device.

Yet another object of the present invention is to provide a power amplifier of the type as described above, which allows cost reduction and realization of a large output.

In a preferred example of the present invention which will be described hereinunder in detail, the power amplifier comprises a circuit for varying in bootstrap fashion the power supply voltage for the output amplifying device, and a circuit for varying said power supply voltage in accordance with the voltage waveshape of the input signal to be amplified, and is arranged so that these circuits are used selectively in accordance with the frequency of the input signal.

BRIEF DESCRIPTION OF THE DRAWINGS

FIG. 4 is a circuit diagram showing the basic arrangement of the power amplifier designed to vary the power supply voltage in bootstrap fashion.

FIG. 5 is a waveshape diagram for explaining the behavior of the power amplifier shown in FIG. 4.

FIG. 6 is a circuit diagram showing the basic arrangement of a cascade amplifier.

DETAILED DESCRIPTION OF THE PREFERRED EMBODIMENTS

Figure 1:
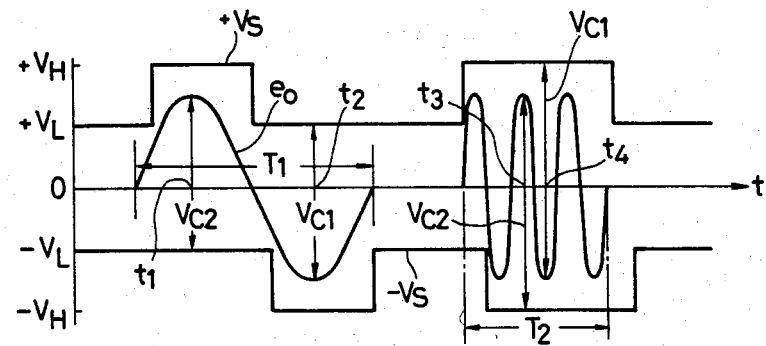
FIGS. 1 and 2 are waveshape diagrams for explaining the behavior of conventional power amplifiers.
Figure 2:
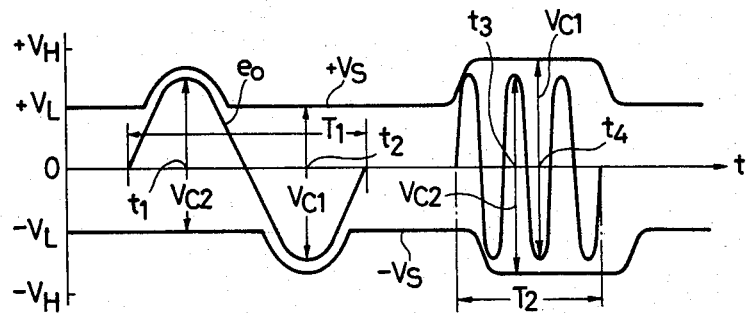
Figure 3:
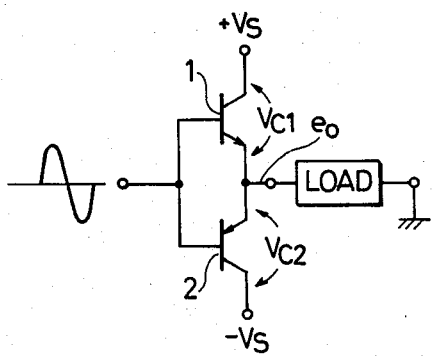
FIG. 3 is a circuit diagram for explaining the behavior of the conventional power amplifiers shown in FIGS. 1 and 2.

For a better understanding of the present invention, description will be made first of the basic arrangement of a power amplifier designed so as to vary the power supply voltage in bootstrap fashion, and of the basic arrangement of the so-called cascade amplifier designed so that the power supply voltage is varied in accordance with the voltage waveshape of the signal to be amplified.

FIG. 4 is a circuit diagram showing the basic arrangement of the power amplifier designed to vary the power supply voltage in bootstrap fashion. In FIG. 4, reference numeral 1 represents an NPN transistor and numeral 2 represents a PNP transistor, both of which constitute output amplifying devices of this amplifier. Numeral 3 represents a voltage amplifying circuit for driving these transistors 1 and 2. A power supply voltage $+V_L$ derived at a power supply terminal 4a is supplied, via a diode 5a, to a collector of the transistor 1, and also a power supply voltage $+V_H$ (wherein: $V_H > V_L$) derived at a power supply terminal 6a is supplied to said collector via an NPN transistor 7a. Between the base of the transistor 1 and the base of the transistor 7a, there are inserted in series a power supply 8a (having a voltage $V_B$) and a diode 9a in this order. Also, to an input terminal of the voltage amplifying circuit 3 is supplied, via a signal input terminal 10, an input signal to be amplified. A load not shown is inserted between a signal output terminal 11 which is connected to a common emitter of the transistors 1 and 2, and a ground terminal 12. It should be noted here that arrangement is provided so that the circuitry on a negative power supply side is complementary with the abovesaid circuitry on the positive power supply side.

In the power amplifier shown in FIG. 4, the relationship between the power supply voltage $+V_S$ which is supplied to the collector of the transistor 1, or the power supply voltage $-V_S$ which is supplied to the collector of the transistor 2, and the output voltage $e_0$ which is derived at the signal output terminal is as shown in FIG. 5. More particularly, in the above-mentioned arrangement, if the voltage $e_0$ is smaller than a predetermined level corresponding to the voltage $\pm V_L$, the voltage $+V_S$ (or $-V_S$) will become a voltage $+V_L$ (or $-V_L$), and when the voltage $e_0$ exceeds said predetermined level, the voltage $+V_S$ (or $-V_S$) will have a value which represents an increase by the voltage $V_B$ over the voltage $e_0$.

Next, FIG. 6 is a circuit diagram showing the basic arrangement of a cascade amplifier. In FIG. 6, to a base of a transistor 7a is supplied a divided voltage obtained by dividing a voltage difference between a voltage $+V_H'$ derived at a power supply terminal 6a and the voltage $e_0'$ (equal to $e_0$) derived at an output terminal of a voltage amplifying circuit 3 by a resistor 13a (having a value $R_1$) and a resistor 14a (having a value $R_2$). It should be noted here also that the circuitry on the negative power supply side is arranged to be complementary with the circuitry on the positive power supply side.

According to this cascade amplifier, the ratio between the voltages applied to the transistor 7a and the transistor 1 is $R_1$ versus $R_2$. Also, similarly, the ratio between the voltages applied to transistors 7b and 2 will become also $R_1$ versus $R_2$. As such, according to this cascade amplifier, it becomes possible to reduce the voltages applied to the transistors 1 and 2 below the level accruing in the absence of the transistors 7a and 7b. And, in this case, the waveshape of the collector voltage $+V_S$ of the transistor 1 and the waveshape of the collector voltage $-V_S$ of the transistor 2 will invariably be analogous to the waveshape of the output voltage $e_0$. Therefore, noise or distortion generation due to switch over the power supply voltage is prevented.

Figure 7:
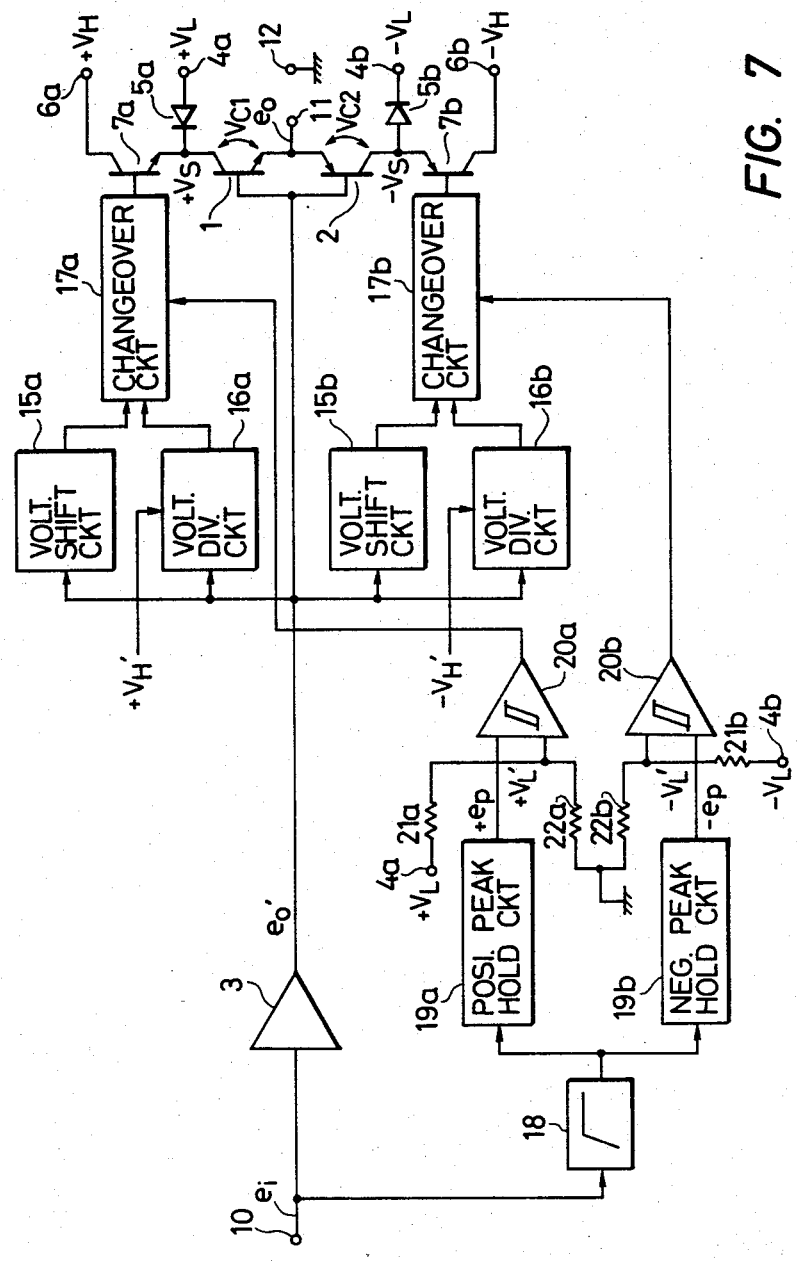
FIG. 7 is a circuit diagram showing the arrangement of an embodiment of the power amplifier according to the present invention.

The arrangement of the power amplifier which is an embodiment of the present invention is shown in FIG. 7. In FIG. 7, an input signal which is supplied to a signal input terminal 10 is supplied to bases (control signal input terminals) of transistors 1 and 2 (second amplifying devices) via a voltage amplifying circuit 3. To the collector (power supply input terminal) of the transistor 1 is supplied, via a diode 5a, a power supply voltage $+V_L$ (second power supply voltage) of a power supply terminal 4a, and is also supplied, via a transistor 7a (first amplifying device), a power supply voltage $+V_H$ (first power supply voltage, wherein $+V_H > +V_L$) of a power supply terminal 6a. To the collector (power supply input terminal) of the transistor 2 is supplied, via a diode 5b, a power supply voltage $-V_L$ derived at a power supply terminal 4b, and is also supplied, via a transistor 7b, a power supply voltage $-V_H$ ($|-V_H| > |-V_L|$) derived at a power supply terminal 6b. Both emitters (output terminals) of the transistors 1 and 2 are connected to a ground terminal 12 via a signal output terminal 11 and a load (not shown) in this order. A numeral 15a represents a voltage shifting circuit which outputs a voltage $e_0'$ of said voltage amplifying circuit 3 after being added with a constant voltage corresponding to a voltage $V_B$ of a power supply 8a shown in FIG. 4. A numeral 16a represents a voltage dividing circuit for outputting a divided voltage between the power supply voltage $+V_H'$ (wherein: $+V_H' > +V_L$) and the voltage $e_0'$. A numeral 17a represents a changeover circuit for selectively supplying the output of the voltage shifting circuit 15a or the output of the voltage dividing circuit 16a to the base (control input terminal) of said transistor 7a in accordance with an output of a hysteresis comparator 20a which will be described later. Also, a numeral 15b is a voltage shifting circuit for outputting an output voltage $e_0'$ after being added with a constant voltage corresponding to a voltage $-V_B$ of the power supply 8b shown in FIG. 4. A numeral 16b represents a voltage dividing circuit for outputting a divided voltage between a power supply voltage $-V_H'$ ($|-V_H'| > |-V_L|$) and the voltage $e_0'$. A numeral 17b represents a changeover circuit for selectively supplying the output of the voltage shifting circuit 15b or the output of the voltage dividing circuit 16b to the base of said transistor 7b in accordance with an output of a hysteresis comparator 20b which will be described later. A numeral 18 represents a high-pass filter for passing a frequency component higher than a predetermined frequency which is, for example, 5 kHz of the input signal supplied to the input terminal 10. Numerals 19a and 19b represent a positive peak holding circuit and a negative peak holding circuit for holding for a predetermined length of time which may be, for example, 200 μs a positive peak voltage and a negative peak voltage of an output signal of said high-pass filter 18, respectively. Numerals 20a and 20b represent the hysteresis comparators, respectively. The hysteresis comparator 20a having a hysteresis characteristic compares an output voltage $+e_P$ of the positive peak holding circuit 19a with a divided voltage $+V_L'$ of the voltage $+V_L$ as divided by resistors 21a and 22a. The comparator commands the changeover circuit 17a to select the output of the voltage dividing circuit 16a when the voltage $+e_P$ exceeds the voltage $+V_L'$, and commands the changeover circuit 17a to select the output of the voltage shifting circuit 15a when the voltage $+e_P$ drops lower than a level which is slightly lower than the voltage $+V_L$. In such instance, arrangement is provided so that the voltage dividing ratio defined by the resistors 21a and 22a will be such as to render the ratio between the voltage $e_0'$ and the voltage $+e_P$ substantially equal to the ratio between the voltage $+V_L$ and $+V_L'$. On the other hand, the hysteresis comparator 20b having a hysteresis characteristic commands the changeover circuit 17b to select the output of the voltage dividing circuit 16b when the output voltage $-e_P$ of the negative peak holding circuit 19b drops lower than the divided voltage $-V_L'$ as defined by resistors 21b and 22b for the voltage $-V_L'$. It commands the changeover circuit 17b to select the output of the voltage shifting circuit 15b when the voltage $-e_P$ rises above a voltage which is slightly higher than the voltage $-V_L'$.

Description will next be made of the operation of the power amplifier having the foregoing arrangement.

Let us now assume that the voltage $e_i$ of the input signal supplied to the signal input terminal 10 has a small amplitude, and the voltage $e_0'$ is between a predetermined level on the positive side which is slightly lower than the voltage $+V_L$ and a predetermined level on the negative side which is slightly higher than the voltage $-V_L$. The hysteresis comparators 20a and 20b will generate commands to the changeover circuits 17a and 17b to select the voltage shifting circuits 15a and 15b regardless of the magnitude of the frequency of the input signal. In such instance, however, the output voltages of the voltage shifting circuits 15a and 15b will not reach a value sufficient for rendering the transistors 7a and 7b conductive. Therefore, the collector voltage $+V_S$ of the transistor 1 and the collector voltage $-V_S$ of the transistor 2 will become $+V_L$ and $-V_L$, respectively.

Figure 8:
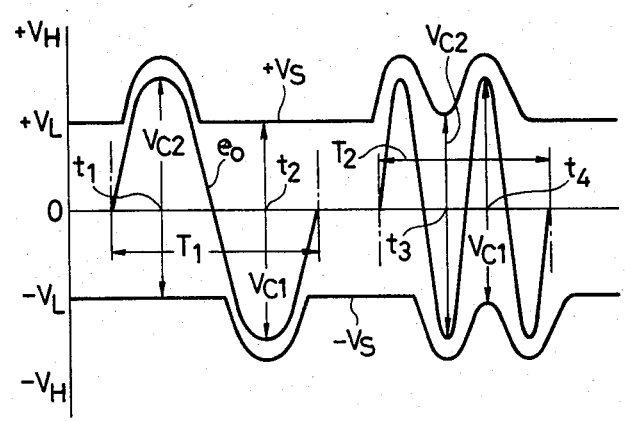
FIG. 8 is a waveshape diagram for explaining the behavior of the embodiment shown in FIG. 7.

Next, in case the amplitude of the input signal voltage $e_i$ is large, the voltage $e_0'$ will exceed a predetermined level on either the positive side or the negative side as shown at the period $T_1$ in FIG. 8. However, in case the frequency of the signal is low, the hysteresis comparators 20a and 20b will command the changeover circuits 17a and 17b to keep selecting the voltage shifting circuits 15a and 15b. In this case, when the voltage $e_0'$ which is substantially equal to the voltage $e_0$ exceeds either one of the predetermined two levels, either the transistor 7a or the transistor 7b is rendered conductive in accordance with the voltage which is in excess of said predetermined level. Accordingly, in this instance, the voltages $+V_S$ and $-V_S$ are varied in bootstrap fashion as shown in the period $T_1$ in FIG. 8.

Next, in case the amplitude of the input signal voltage $e_i$ is large, and in case, accordingly, the voltage $e_0'$ exceeds a predetermined level on either the positive side or the negative side and the frequency of the input signal is higher than a predetermined frequency set for the abovesaid high-pass filter 18 as shown in the period $T_2$ in FIG. 8, the hysteresis comparator 20a will command the changeover circuit 17a to select the voltage dividing circuit 16a in response to the positive peak voltage, whereas the hysteresis comparator 20b will command to the changeover circuit 17b to select the voltage dividing circuit 16b in response to the negative peak voltage. In such instance, the conduction of transistor 7a is controlled by the divided voltage between the voltage $+V_H'$ and the voltage $e_0'$, whereas the conduction of transistor 7b is controlled by the divided voltage between the voltage $-V_H'$ and the voltage $e_0'$. Accordingly, in this case, if the voltage dividing characteristics of the voltage dividing circuits 16a and 16b are set to appropriate characteristics, the voltages $+V_S$ and $-V_S$ will vary between the voltage $+V_L$ and the voltage $+V_H$ and between the voltage $-V_L$ and the voltage $-V_H$, respectively, with such waveshape as is analogous to the voltage $e_0'$ (or voltage $e_0$) as shown in the period $T_2$ in FIG. 8, i.e. said voltages will vary in such fashion of behavior as exerted by a cascade amplifier, preventing the noise or distortion generation due to changeover of the power supply voltage.

Here, consideration will be made of the voltages $V_{C1}$ and $V_{C2}$ (the collector-emitter voltage) which are applied to the transistors 1 and 2 by referring to FIG. 8. Firstly, in case the frequency of the input signal is low as shown in the period $T_1$ in FIG. 8, the voltages $V_{C1}$ and $V_{C2}$ will become maximum respectively at time $t_2$ and time $t_1$. In this case, the maximum value of the voltages $V_{C1}$ and $V_{C2}$ is $(V_L+V_H)$. Next, in case the frequency of the input signal is high as shown in the period $T_2$, the voltages $V_{C1}$ and $V_{C2}$ will become maximum at time $t_4$ and time $t_3$, respectively. In this case also, the maximum value of the voltages $V_{C1}$ and $V_{C2}$ will be $(V_L+V_H)$.

As stated above, according to this embodiment, the power amplifier will operate at high power efficiency regardless of the magnitude of the signal to be amplified, and it becomes possible to suppress the power supply voltage which is applied to the output amplifying devices to a value which is lower than the value applied in the conventional power amplifier.

Figure 9:
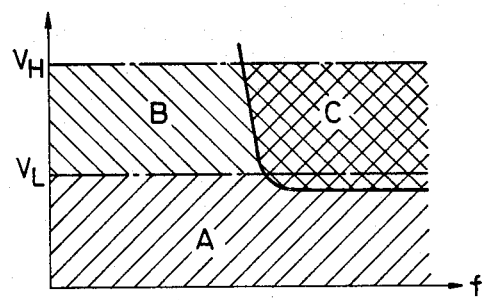
FIG. 9 is an illustration for explaining the operation mode of the embodiment of FIG. 7.

FIG. 9 is an illustration showing the operation mode of the power amplifier according to this instant embodiment. As shown in FIG. 9, the power amplifier of this embodiment is operated by using a power supply voltage $\pm V_L$ in the region wherein the amplitude of the input signal is lower than a predetermined level as shown by the hatched region A. However, in the region wherein the amplitude of the input signal exceeds the predetermined level as shown by the hatched region B but wherein the frequency of this signal is low, the power supply voltage is changed over to a real time in a bootstrap fashion. Furthermore, in case the amplitude of the input signal is in excess of the predetermined level and wherein the frequency of the signal is high as shown by the netshaped region C, the power supply voltage will be varied, following the operation of a cascade amplifier.

Figure 10:
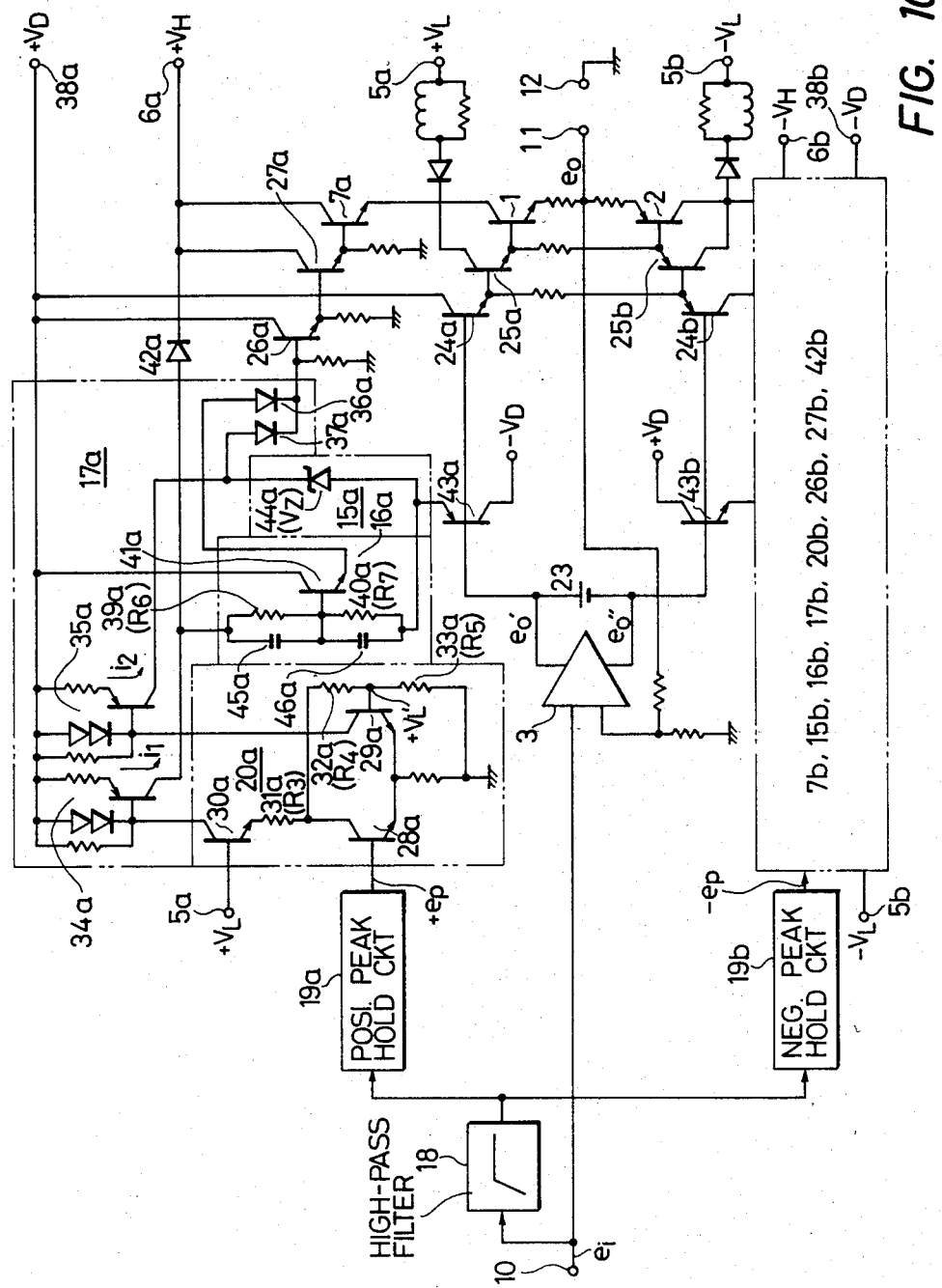
FIG. 10 is a circuit diagram showing a specific circuit of the power amplifier according to the present invention.

An example of the specific circuit of the power amplifier according to the present invention is shown in FIG. 10. In FIG. 10, the outputs $e_0'$ and $e_0''$ of the voltage amplifying circuit 3 are supplied to the bases of an NPN transistor 24a and a PNP transistor 24b, respectively, after being imparted with a bias voltage by a biasing power supply 23. The NPN transistors 24a and 25a are driving transistors for the transistor 1, whereas the PNP transistors 24b and 25b are driving transistors for the transistor 2. Also, a transistor 7a is arranged to be driven by transistors 26a and 27a. The hysteresis comparator 20a is comprised of, for example, NPN transistors 28a, 29a and 30a. To the base of the transistor 28a is supplied an output $+e_P$ of a positive peak holding circuit 19a. To the base of the transistor 29a is applied a voltage $+[R_5/(R_3+R_4+R_5)]\times V_L$ by a voltage dividing circuit which is comprised of a resistor 31a (having a value $R_3$), a resistor 32a (having a value $R_4$) and a resistor 33a (having a value $R_5$). In this case, the resistance values $R_3$, $R_4$ and $R_5$ are set so that the ratio between the voltage $e_0'$ and the voltage $e_P$ is substantially equal to the ratio between the voltage $+V_L$ and the voltage $+[R_5/(R_3+R_4+R_5)\times V_L$. It should be noted here that the transistor 30a and the resistor 31a are provided to impart a hysteresis characteristic to the operations of the transistors 28a and 29a, respectively. Accordingly, with the hysteresis comparator 20a, it will be the usual trend that the transistor 29a is rendered conductive, and the transistor 28a is rendered nonconductive, and when the voltage $e_0'$ exceeds the predetermined level corresponding to the voltage $+V_L$, the transistor 28a is rendered conductive, and the transistor 29a is rendered non-conductive. Also, when the voltage $e_0'$ drops to a level lower than the voltage which is slightly lower than the predetermined level, the transistor 28a is rendered non-conductive and the transistor 29a is rendered conductive.

A changeover circuit 17a is comprised of a constant current circuit 34a which does not output a current when said transistor 28a is non-conductive but outputs a current $i_1$ when this transistor 28a becomes conductive; a constant current circuit 35a which does not output a current when said transistor 29a is non-conductive but outputs a current $i_2$ when this transistor 29a becomes conductive; and diodes 36a and 37a which will be described later. Here, the constant current circuits 34a and 35a are supplied with a power supply voltage $+V_D$ (wherein: $+V_D>V_H$) derived at a power supply terminal 38a.

A voltage dividing circuit 16a is comprised of a resistor 39a (having a value $R_6$), a resistor 40a (having a value $R_7$) and an NPN transistor 41a. In this voltage dividing circuit 16a, in case the constant current circuit 34a is outputting a current $i_1$, the terminal voltage of the resistor 39a on the constant current circuit 34a side becomes fixed at a voltage $+V_H$ due to the action of a diode 42a. Also, the terminal voltage of the resistor 40a on a PNP transistor 43a (voltage buffer) side will become $e_0'$ (substantially equal to $e_0$) due to the action of this transistor 43a. Accordingly, this voltage dividing circuit 16a is operative so that, when it is provided with the current $i_1$, it divides the voltage between the voltage $+V_H$ and the voltage $e_0'$ by its resistors 39a and 40a, and outputs this divided voltage after current-amplification by the NPN transistor 41a. And, the output of this voltage dividing circuit 16a serves to drive the transistor 26a via the diode 36a.

A voltage shifting circuit 15a is comprised of a Zener diode 44a inserted between the constant current circuit 35a and the transistor 43a. This Zener diode 44a is operative so that, when it is provided with the current $i_2$, it generates a Zener voltage $V_Z$ corresponding to the voltage $V_B$ as shown in FIG. 4, and outputs a voltage which is the sum of the voltage $e_0'$ and this Zener voltage $V_Z$. The output voltage of this Zener diode 44a is adapted to drive the transistor 26a via the diode 37a.

It should be noted that, in said voltage dividing circuit 16a, capacitors 45a and 46a are provided in order to compensate for the frequency characteristic due to the resistors 39a, 40a and to the input capacity of the transistor 41a. Also, in this concrete circuit, the respective sections provided on the negative power supply side are of the arrangement which is complementary with the above-stated respective sections provided on the positive power supply side.

According to the specific circuit shown in FIG. 10, it will be noted that, by setting the abovesaid resistance values $R_6$ and $R_7$ to become $$R_6/(R_6+R_7)=(V_H-V_L)/2V_H,$$

it will be possible to have this circuit operate in such manner as shown in FIG. 8.

What is claimed is:

1. A power amplifier with power supply switching, comprising:
    a first amplifying device having a control signal input terminal, a power supply input terminal, and an output terminal, said power supply input terminal being applied with a first power supply voltage;
    a second amplifying device having a control signal input terminal, a power supply input terminal, and an output terminal, said power supply input terminal being coupled to a second power supply voltage, whose absolute value is lower in magnitude than an absolute value of said first power supply voltage, via switching means and the output terminal of said first amplifying device, said control signal input terminal being coupled to an input terminal of the amplifier which is applied with an input signal to be amplified, and said output terminal being coupled to a load via an output terminal of the amplifier;
    voltage shifting means for shifting a voltage corresponding to said input signal by a first predetermined voltage;
    first voltage dividing means for dividing a voltage difference between said voltage corresponding to the input signal and constant voltage having an absolute value greater than said second power supply voltage; and
    control means for selectively supplying to the control input terminal of said first amplifying device a shifted output of said voltage shifting means or a divided output of said first voltage dividing means, in response to the magnitude of the frequency of said input signal when the voltage of said input signal is greater than a predetermined value.

2. A power amplifier according to claim 1, in which:
    said control means comprises:
    changeover means for selectively supplying to the control input terminal of said first amplifying device a shifted output of said voltage shifting means or a divided output of said first voltage dividing means; and
    changeover control means for controlling a changeover operation of said changeover means in response to magnitude of the frequency of said input signal.

3. A power amplifier according to claim 2, in which:
    said changeover control means is enabled to change over said changeover means only when the frequency of said input signal is higher than a first predetermined frequency.

4. A power amplifier according to claim 3, in which:
    said changeover control means comprises comparing means for comparing a peak voltage of said input signal having a frequency above said first predetermined frequency and supplied to one of its input terminals with a second predetermined voltage having an absolute value lower than the absolute value of said second power supply voltage and supplied to the other of said input terminals, and outputting a control signal for changeover means in response to a comparison result thereof.

5. A power amplifier according to claim 4, in which:
said changeover control means further comprises filter means coupled to said input terminal of the amplifier and passing therethrough a frequency component, above said first predetermined frequency, of said input signal; and
peak holding means coupled to said filter means and holding the peak voltage of the input signal having been passed through said filter means and supplying said peak voltage to said one of the input terminals of said comparing means.

6. A power amplifier according to claim 5, further comprising:
voltage amplifying means coupled between said input terminal of the amplifier and the control signal input terminal of said second amplifying device for voltage-amplifying the input signal and applying the voltage-amplified input signal to the control signal input terminal of said second amplifying device as a driving signal.

7. A power amplifier according to claim 6, in which:
said filter means is provided for the input signal prior to its voltage amplification by said voltage amplifying means.

8. A power amplifier according to claim 7, further comprising:
second voltage dividing means for generating a second predetermined voltage having an absolute value lower than the absolute value of said second power supply voltage and supplying the second predetermined voltage to the other of the input terminals of said comparing means, by dividing said second power supply voltage,
said second voltage dividing means having a voltage dividing ratio set to render a ratio between the input signal voltage applied to the control signal input terminal of said second amplifying device and said peak voltage to be substantially equal to a ratio between said second power supply voltage and said second predetermined voltage.

9. A power amplifier according to claim 8, in which:
said first and second amplifying devices are both comprised of transistors, respectively,
the power supply input terminals of said first and second amplifying devices are collectors of said transistors,
the output terminals of said first and second amplifying devices are emitters of said transistors, and
the control signal input terminals of said first and second amplifying devices are bases of said transistors.

10. A power amplifier according to claim 1, in which:
said switching means comprises a diode coupled between the power supply input terminal of said second amplifying device and said second power supply voltage.

11. A power amplifier with power supply switching, comprising:
a first amplifying device having a control signal input terminal, a power supply input terminal, and an output terminal, said power supply input terminal being applied with a first positive power supply voltage;
a second amplifying device having a control signal input terminal, a power supply input terminal, and an output terminal, said power supply input terminal being coupled to a second positive power supply voltage whose absolute value is lower in magnitude than an absolute value of said first positive power supply voltage via first switching means and the output terminal of said first amplifying device;
a third amplifying device having a control signal input terminal, a power supply input terminal, and an output terminal, said power supply input terminal being applied with a first negative power supply voltage;
a fourth amplifying device having a control signal input terminal, a power supply input terminal, and an output terminal, said power supply input terminal being coupled to a second negative power supply voltage whose absolute value is lower in magnitude than an absolute value of said first negative power supply voltage via second switching means and the output terminal of said third amplifying device;
the control signal input terminals of said second and fourth amplifying devices being coupled to an input terminal of the amplifier which is applied with an input signal to be amplified;
the output terminals of said second and fourth amplifying devices being coupled to a load via an output terminal of the amplifier;
first voltage shifting means for shifting a first voltage corresponding to said input signal by a first predetermined voltage;
second voltage shifting means for shifting a second voltage corresponding to said input signal by a second predetermined voltage;
first voltage dividing means for dividing a voltage difference between said first voltage and a first constant voltage having an absolute value greater than the absolute value of said second positive power supply voltage;
second voltage dividing means for dividing a voltage difference between said second voltage and a second constant voltage having an absolute value greater than the absolute value of said second negative power supply voltage; and
control means for selectively supplying to the control input terminal of said first amplifying device a shifted output of said first voltage shifting means or a divided output of said first voltage dividing means, and for selectively supplying to the control input terminal of said third amplifying device a shifted output of said second voltage shifting means or a divided output of, said second voltage dividing means, in response to the magnitude of the frequency of said input signal when the voltage of said input signal is greater than a predetermined value.

12. A power amplifier according to claim 11, in which:
said control means comprises:
first changeover means for selectively supplying to the control input terminal of said first amplifying device a shifted output of said first voltage shifting means or a divided output of said first voltage dividing means;
second changeover means for selectively supplying to the control input terminal of said third amplifying device a shifted output of said second voltage shifting means or a divided output of said second voltage dividing means; and changeover control means for controlling changeover operations of said first and second changeover means in response to magnitude of the frequency of said input signal.

13. A power amplifier according to claim 12, in which:
said changeover control means is enabled to change over said changeover means only when the frequency of said input signal is higher than a first predetermined frequency.

14. A power amplifier according to claim 13, in which:
said changeover control means comprises:
first comparing means for comparing a positive peak voltage of said input signal having a frequency above said first predetermined frequency and supplied to one of its input terminals with a third predetermined voltage having an absolute value lower than the absolute value of said second positive power supply voltage and supplied to the other of said input terminals, and outputting a control signal for first changeover means in response to a comparison result thereof; and
second comparing means for comparing a negative peak voltage of said input signal having a frequency above said first predetermined frequency and supplied to one of its input terminals with a fourth predetermined voltage having an absolute value lower than the absolute value of said second negative power supply voltage and supplied to the other of said input terminals, and outputting a control signal for second changeover means in response to a comparison result thereof.

15. A power amplifier according to claim 14, in which:
said changeover control means further comprises filter means coupled to said input terminal of the amplifier and passing therethrough a frequency component, above said first predetermined frequency, of said input signal;
first peak holding means coupled to said filter means and holding the positive peak voltage of the input signal having been passed through said filter means and supplying said positive peak voltage to said one of the input terminals of said first comparing means; and
second peak holding means coupled to said filter means and holding the negative peak voltage of the input signal having been passed through said filter means and supplying said negative peak voltage to said one of the input terminals of said second comparing means.

16. A power amplifier according to claim 15, further comprising:
voltage amplifying means coupled between said input terminal of the amplifier and the control signal input terminals of said second and fourth amplifying devices and voltage-amplifying the input signal and applying the voltage-amplified input signal to the control signal input terminals of said second and fourth amplifying devices as a driving signal.

17. A power amplifier according to claim 16, in which:
said filter means is provided for the input signal prior to its voltage amplification by said voltage amplifying means.

18. A power amplifier according to claim 17, further comprising:
third voltage dividing means for generating a third predetermined voltage having an absolute value lower than the absolute value of said second positive power supply voltage and supplying the third predetermined voltage to the other of the input terminals of said first comparing means, by dividing said second positive power supply voltage,
said third voltage dividing means having a voltage dividing ratio set to render a ratio between the input signal voltage applied to the control signal input terminal of said second amplifying device and said positive peak voltage to be substantially equal to a ratio between said second positive power supply voltage and said third predetermined voltage, and
fourth voltage dividing means for generating a fourth predetermined voltage having an absolute value lower than the absolute value of said second negative power supply voltage and supplying the fourth predetermined voltage to the other of the input terminals of said second comparing means, by dividing said second negative power supply voltage,
said fourth voltage dividing means having a voltage dividing ratio set to render a ratio between the input signal voltage applied to the control signal input terminal of said fourth amplifying device and said negative peak voltage to be substantially equal to a ratio between said second negative power supply voltage and said fourth predetermined voltage.

19. A power amplifier according to claim 11, in which:
said first and second amplifying devices are both comprised of NPN transistors, and said third and fourth amplifying devices are both comprised of PNP transistors, respectively,
the power supply input terminals of said first through fourth amplifying devices are collectors of said transistors,
the output terminals of said first through fourth amplifying devices are emitters of said transistors, and
the control signal input terminals of said first through fourth amplifying devices are bases of said transistors.

20. A power amplifier according to claim 11, in which:
said first switching means comprises a diode having a cathode electrode coupled to the power supply input terminal of said second amplifying device and an anode coupled to said second positive power supply voltage; and
said second switching means comprises a diode having an anode electrode coupled to the power supply input terminal of said fourth amplifying device and a cathode electrode coupled to said second negative power supply voltage.

* * * * *